US012470187B2

(12) United States Patent
Wen et al.

(10) Patent No.: US 12,470,187 B2
(45) Date of Patent: Nov. 11, 2025

(54) PLAY MUTE CIRCUIT AND METHOD

(71) Applicants: STMicroelectronics S.r.l., Agrate Brianza (IT); STMicroelectronics (Shenzhen) R&D Co. Ltd., Shenzhen (CN)

(72) Inventors: Jian Wen, Shenzhen (CN); Davide Luigi Brambilla, Segrate (IT); Qiyu Liu, Shenzhen (CN); Mei Yang, Shenzhen (CN); Shuming Tong, Shenzhen (CN); Francesco Stilgenbauer, Rho (IT)

(73) Assignees: STMicroelectronics S.r.l., Agrate Brianza (IT); STMicroelectronics (Shenzhen) R&D Co. Ltd., Shenzhen (CN)

( * ) Notice: Subject to any disclaimer, the term of this patent is extended or adjusted under 35 U.S.C. 154(b) by 692 days.

(21) Appl. No.: 17/747,845

(22) Filed: May 18, 2022

(65) Prior Publication Data
US 2023/0378923 A1 Nov. 23, 2023

(51) Int. Cl.
*H03F 3/72* (2006.01)
*H03G 3/30* (2006.01)
(Continued)

(52) U.S. Cl.
CPC ......... *H03G 3/3026* (2013.01); *H03G 3/3036* (2013.01); *H03G 3/348* (2013.01); *H03K 4/06* (2013.01)

(58) Field of Classification Search
CPC ...... H03F 1/303; H03F 1/3205; H03F 1/3211; H03F 2200/211; H03F 3/72; H03F 2200/261; H03F 2203/45134; H03F 2203/45138; H03F 2203/45594; H03F 2203/45601; H03F 2203/45604;
(Continued)

(56) References Cited

U.S. PATENT DOCUMENTS 4,107,614 A 8/1978 Sugai
5,063,597 A 11/1991 Seo et al.
(Continued)

FOREIGN PATENT DOCUMENTS

EP 0590706 A1 4/1994
JP 2000341047 A 12/2000
JP 2002299973 A 10/2002

*Primary Examiner* — Andrea Lindgren Baltzell
*Assistant Examiner* — Khiem D Nguyen
(74) *Attorney, Agent, or Firm* — Slater Matsil, LLP

(57) ABSTRACT

In an embodiment, an amplifier circuit includes a second stage that includes a first switch circuit including first and second terminals, a plurality of resistive elements coupled between the first and second terminals of the first switch circuit, and a plurality of switches configured to control an equivalent resistance between the first and second terminals of the first switch circuit. During play mode, the second stage has a gain between the input of the second stage and the output of the second stage of a first value. During a transition from mute mode to play mode, the amplifier circuit is configured to progressively increase the gain of the second stage from a second value to the first value. During a transition from play mode to mute mode, the amplifier circuit is configured to progressively decrease the gain of the second stage from the first value to the second value.

23 Claims, 9 Drawing Sheets

(51) Int. Cl.
*H03G 3/34* (2006.01)
*H03K 4/06* (2006.01)

(58) Field of Classification Search
CPC . H03F 2203/45616; H03F 2203/45656; H03F 2203/45658; H03F 2203/45696; H03F 2203/45698; H03F 2203/45702; H03F 3/45183; H03F 3/185; H03F 2200/03; H03F 3/183; H03F 3/45076; H03F 3/45179; H03G 3/3026; H03G 3/3036; H03G 3/348; H03G 3/34; H03K 4/06
USPC .................................. 330/278, 51, 207 A, 10
See application file for complete search history.

(56) References Cited

U.S. PATENT DOCUMENTS

| | | | |
|---|---|---|---|
| 5,300,892 | A | 4/1994 | Hirai |
| 6,384,645 | B2 | 5/2002 | Brambilla et al. |
| 9,386,372 | B2 | 7/2016 | Li et al. |
| 2002/0186047 | A1* | 12/2002 | Sterrantino ......... H03F 3/45179 326/86 |
| 2010/0315163 | A1 | 12/2010 | Takagi et al. |

* cited by examiner

Prior Art

PLAY MUTE CIRCUIT AND METHOD

TECHNICAL FIELD

The present disclosure relates generally to an electronic system and method, and, in particular embodiments, to a play mute circuit and method.

BACKGROUND

FIG. 1 shows a schematic diagram of exemplary analog input audio amplifier 100. Amplifier 100 includes pre-amplifier stage 102 and second stage 122.

During normal operation, inputs Inp and Inm receive a differential audio input signal Vin (Vinp−Vinm) and outputs Outp and Outm produce an amplified differential audio output signal Vout (Voutp−Voutm) based on the differential audio input signal Vin. As shown, the gain of second stage 122 is Rf/Re.

FIG. 2 shows a schematic diagram of exemplary pre-amplifier stage 102. As shown, pre-amplifier stage 102 is capable of transitioning between play and mute modes based on signal PM.

When voltage PM is higher than voltage $V_{ref}$, transistors 204 and 206 are turned on, and transistors 212 and 214 are turned off, thereby causing pre-amplifier stage 102 to operate in play mode. For example, when voltage PM is higher than voltage $V_{ref}$, play transistors 230 and 232, and 234 and 236 are biased with currents Iplay_p and Iplay_m, respectively, while mute transistors 222, 224, 226, and 228 are off. Thus, during play mode, transistors 230, 232 and 234 and 236 generate differential output voltage Vout_pre (Vop_pre−Vom_pre) based on differential input voltage Vin (Vinp−Vinm).

When voltage PM is lower than voltage $V_{ref}$, transistors 204 and 206 are turned off, and transistors 212 and 214 are turned on, thereby causing pre-amplifier stage 102 to operate in mute mode. For example, when voltage PM is lower than voltage $V_{ref}$, mute transistors 222 and 224, and 226 and 228 are biased with currents Imute_p and Imute_m, respectively, while play transistors 230, 232, 234, and 236 are off. Thus, during mute mode, transistors 222, 224, 226, and 228 generate differential output voltage Vout_pre (Vop_pre−Vom_pre) that is ideally zero (since the inputs to transistors 222 and 228 are tied together).

In some applications, when a transition from mute mode to play mode is desired, voltage PM may be ramped up with a linear ramp, e.g., lasting a few ms, from below voltage Vref to above voltage Vref. When a transition from play mode to mute mode is desired, voltage PM may be ramped down with a linear ramp, e.g., lasting a few ms, from above voltage Vref to below voltage Vref.

SUMMARY

In accordance with an embodiment, an amplifier circuit is configured to operate in a play mode and a mute mode, and includes: an input stage configured to receive an input signal; and a second stage having an input coupled to an output of the input stage, the second stage including a first switch circuit including first and second terminals, a plurality of resistive elements coupled between the first and second terminals of the first switch circuit, and a plurality of switches configured to control an equivalent resistance between the first and second terminals of the first switch circuit, where: during the play mode, the amplifier circuit is configured to generate an output signal at an output of the second stage based on the input signal, where, during play mode, the second stage has a gain between the input of the second stage and the output of the second stage of a first value, during a transition from the mute mode to the play mode, the amplifier circuit is configured to progressively increase the gain of the second stage from a second value to the first value by progressively turning on or off the plurality of switches, and during a transition from the play mode to the mute mode, the amplifier circuit is configured to progressively decrease the gain of the second stage from the first value to the second value by progressively turning on or off the plurality of switches.

In accordance with an embodiment, a method for operating an amplifier circuit having a play mode and a mute mode includes: receiving an input signal at an input of an input stage, where a second stage has an input coupled to an output of the input stage, the second stage including a first switch circuit including first and second terminals, a plurality of resistive elements coupled between the first and second terminals of the first switch circuit, and a plurality of switches configured to control an equivalent resistance between the first and second terminals of the first switch circuit; during the play mode, generating an output signal at an output of the second stage based on the input signal, where, during play mode, the second stage has a gain between the input of the second stage and the output of the second stage of a first value; during a transition from the mute mode to the play mode, progressively increasing the gain of the second stage from a second value to the first value by progressively turning on or off the plurality of switches; and during a transition from the play mode to the mute mode, progressively decreasing the gain of the second stage from the first value to the second value by progressively turning on or off the plurality of switches.

In accordance with an embodiment, a differential audio amplifier is configured to operate in a play mode and a mute mode, and includes: a differential input stage configured to receive a differential input audio signal; and a differential second stage having a differential input coupled to a differential output of the differential input stage, the differential second stage including first and second switch circuits, each of the first and second switch circuits including first and second terminals, a plurality of resistive elements coupled between the first and second terminals, and a plurality of switches configured to control an equivalent resistance between the first and second terminals, where: during the play mode, the differential audio amplifier is configured to generate a differential audio output signal at a differential output of the differential second stage based on the differential input audio signal, where, during play mode, the differential second stage has a gain between the differential input of the differential second stage and the differential output of the differential second stage of a first value, during a transition from the mute mode to the play mode, the differential audio amplifier is configured to progressively increase the gain of the differential second stage from a second value to the first value by progressively turning on or off the plurality of switches of the first and second switch circuits, and during a transition from the play mode to the mute mode, the differential audio amplifier is configured to progressively decrease the gain of the differential second stage from the first value to the second value by progressively turning on or off the plurality of switches of the first and second switch circuits.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
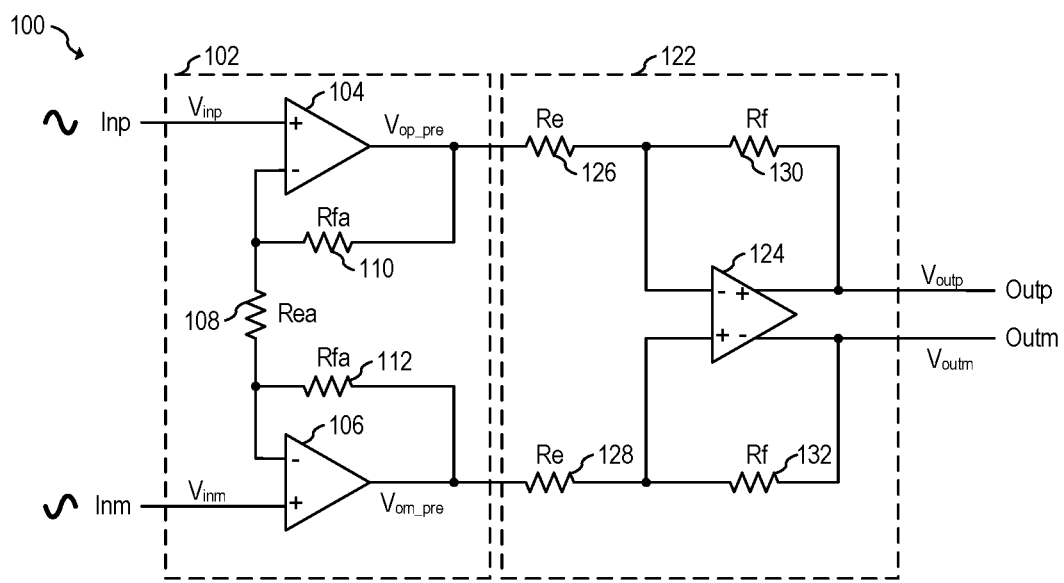
FIG. 1 shows a schematic diagram of an exemplary analog input audio amplifier.
Figure 2:
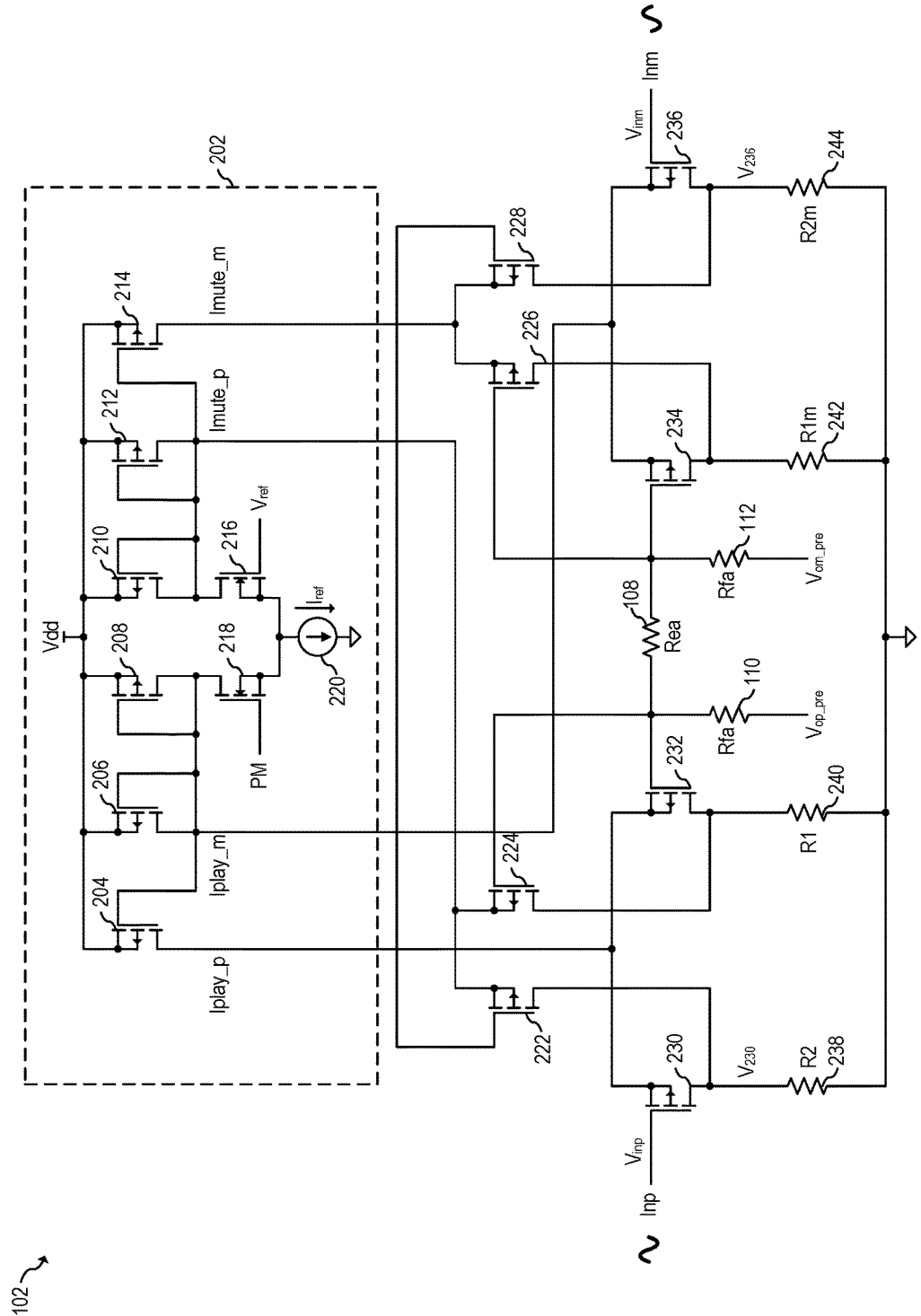
FIG. 2 shows a schematic diagram of the exemplary pre-amplifier stage of FIG. 1.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., a play mute circuit for use in an analog input audio amplifier using metal-oxide semiconductor filed-effect transistors (MOSFETs). Some embodiments may be used with a digital input audio amplifier. Some embodiments may be used in applications different from audio applications.

Pre-amplifier stage 102 may be susceptible to a relatively high parasitic capacitance Cgd between the gate and drain of transistors 230 and 236. In some applications, during mute mode, the parasitic capacitance Cgd of transistors 230 and 236 may allow voltages $V_{imp}$ and $V_{imm}$ (e.g., in an attenuated and/or distorted manner) to propagate to voltages $V_{230}$ and $V_{236}$ which may then be amplified and prevent voltages Vop_pre and Vom_pre to achieve a differential output voltage of 0 mV during mute mode (and thus, may prevent analog input audio amplifier 100 to achieve an inaudible value during mute mode).

In an embodiment of the present invention, an audio amplifier uses a plurality of pass gates to achieve a soft transition between mute mode and play mode. During a transition from play mode to mute mode, the pass gates are progressively turned off (open). During a transition from mute mode to play mode, the pass gates are progressively turned on (closed). By using pass gates to transition between play mode and mute mode, some embodiments advantageously achieve inaudible outputs during mute mode even when the parasitic gate-to-drain capacitances of the input transistors of the audio amplifier is relatively high. By progressively tuning on/off the plurality of pass gates to transition between play mode and mute mode, some embodiments advantageously achieve lower distortion during the transition between play mode and mute mode.

Figure 3:
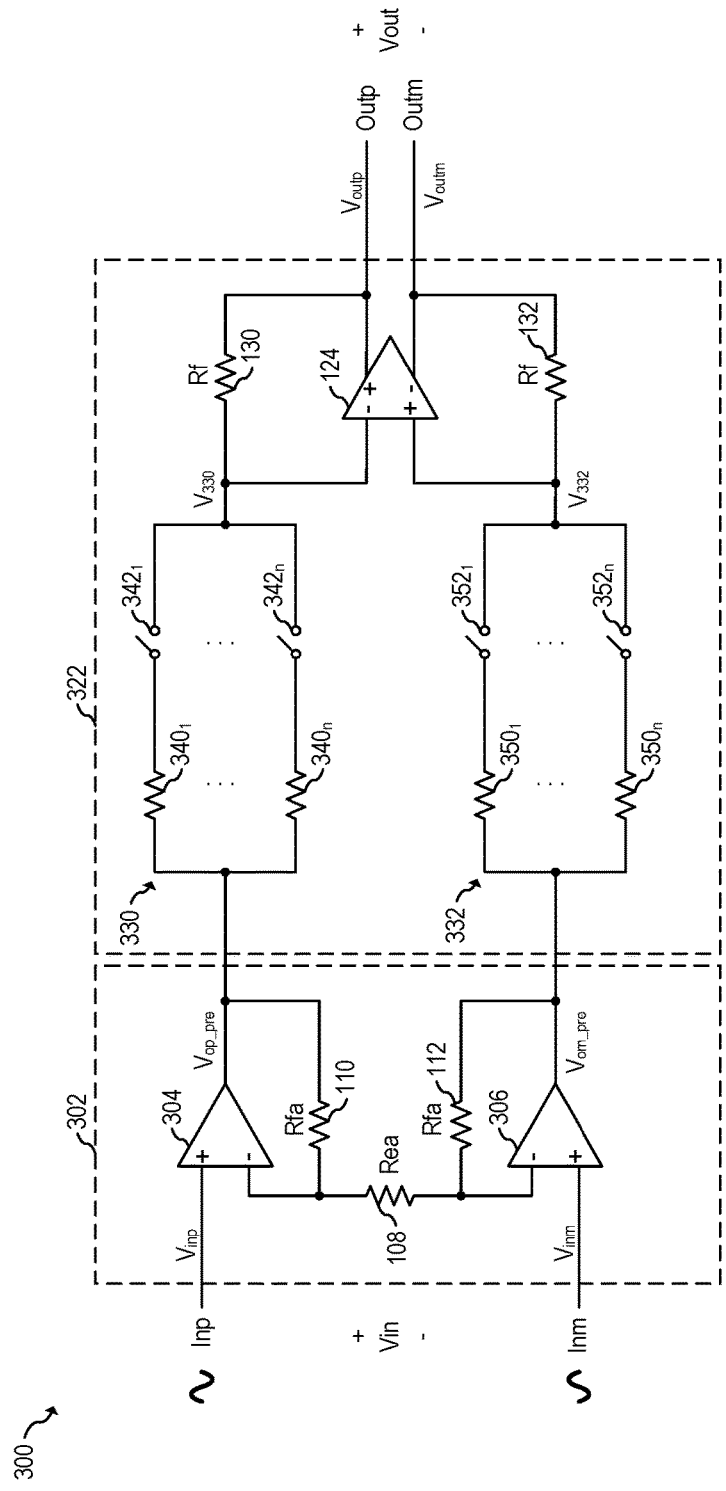
FIG. 3 shows a schematic diagram of an analog input audio amplifier, according to an embodiment of the present invention.

FIG. 3 shows a schematic diagram of analog input audio amplifier 330, according to an embodiment of the present invention. Amplifier 300 includes pre-amplifier stage 302 and second stage 322 and is capable of operating in play mode and mute mode. Second stage 322 includes switch circuits 330 and 332.

As shown in FIG. 3, in some embodiments, each of switch circuits 330 and 332 includes a plurality of resistors. For example, in some embodiments, n is equal to 2, switch circuit 330 includes 2 resistors ($340_1$ and $340_2$) in series with respective switches ($342_1$ and $342_2$), and switch circuit 332 includes 2 resistors ($350_1$ and $350_2$) in series with respective switches ($352_1$ and $352_2$). In some embodiments, n may be a positive integer higher than 2, such as 3, 4, 5, 6, or more.

During play mode, switch circuits 330 and 332 are closed (all of the switches of switch circuits 330 and 332, such as all switches 342 and 352 are closed) and outputs Outp and Outm produce an amplified differential audio output signal Vout (Voutp−Voutm) based on the differential audio input signal Vin (Vinp−Vinm). In some embodiments, the equivalent resistance of the plurality of resistors (e.g., $340_1$ to $340_n$) of switch circuit 330 is Re and the equivalent resistance of the plurality of resistors (e.g., $350_1$ and $350_n$) of switch circuit 332 is Re so that the gain of second stage 322 is Rf/Re during play mode.

In some embodiments, the gain Rf/Re of second stage 322 may be, e.g., 10. gain values greater than 10, such as 12, 20, or more, or lower than 10, such as 9, 8, or lower, may also be used.

During mute mode, switches 330 and 332 are open (all of the switches of switch circuits 330 and 332, such as all switches 342 and 352 are open) and voltages Vop_pre and Vom_pre are not propagated to respective inputs of operational amplifier 124, thereby advantageously preventing content of the differential audio input signal Vin to propagate to the differential output signal Vout.

In some embodiments, pre-amplifier stage 302 may be implemented in a similar manner as pre-amplifier stage 102. In some embodiments, pre-amplifier stage 302 may be implemented in a similar manner as pre-amplifier stage 102 while omitting mute transistors 222, 224, 226, and 228, and replacing circuit 202 with two current sources for (e.g., continuously) biasing transistors 230 and 232, and 234 and 236, respectively. In some embodiments, pre-amplifier stage 320 may be implemented in other ways known in the art.

In some embodiments, the switches of each of switch circuits 330 and 332 (e.g., $342_1$ to $342_n$ and $352_1$ to $352_n$) are implemented as pass gates. For example, in some embodiments, each switch $342_1$ to $342_n$ and $352_1$ to $352_n$ is implemented with a plurality of pass gates using complementary metal-oxide semiconductor (CMOS) transistors. In some embodiments, switch circuit 330 is identical to switch circuit 332. Other implementations are also possible.

Figure 4B:
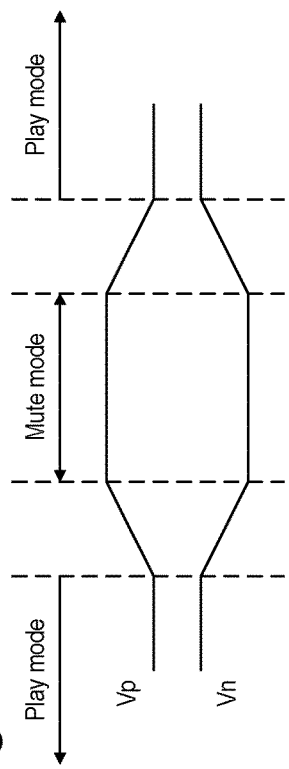
FIG. 4B shows waveforms of the pass gate of FIG. 4A during transitions between mute mode and play mode, according to an embodiment of the present invention.
Figure 4A:
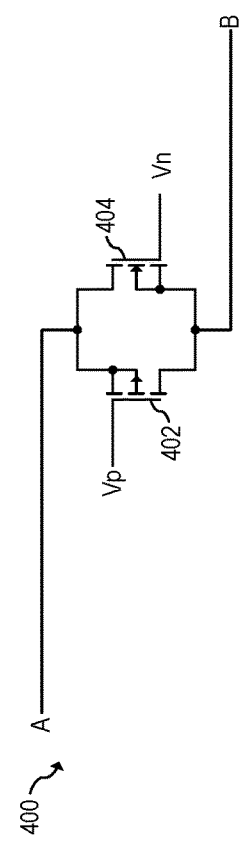
FIG. 4A shows a schematic diagram of a pass gate, according to an embodiment of the present invention.

FIG. 4A shows a schematic diagram of pass gate 400, according to an embodiment of the present invention. Pass gate 400 includes PMOS 402 and NMOS 404. During mute mode, voltage Vp is high and voltage Vn is low. During play mode, voltage Vp is low and voltage Vn is high. In some embodiments, each of the switches of switch circuits 330 and 332 (e.g., $342_1$ to $342_n$ and $352_1$ to $352_n$) may be implemented as pass gate 400.

In some embodiments, transitioning from mute mode to play mode comprises applying a positive voltage ramp to the gate of transistor 402 while applying a negative voltage ramp to the gate of transistor 404, and transitioning from play mode to mute mode comprises applying a negative voltage ramp to the gate of transistor 402 while applying a positive voltage ramp to the gate of transistor 404. For example, FIG. 4B shows waveforms of voltages Vp and Vn during transitions between mute mode and play mode, according to an embodiment of the present invention.

Figure 5A:
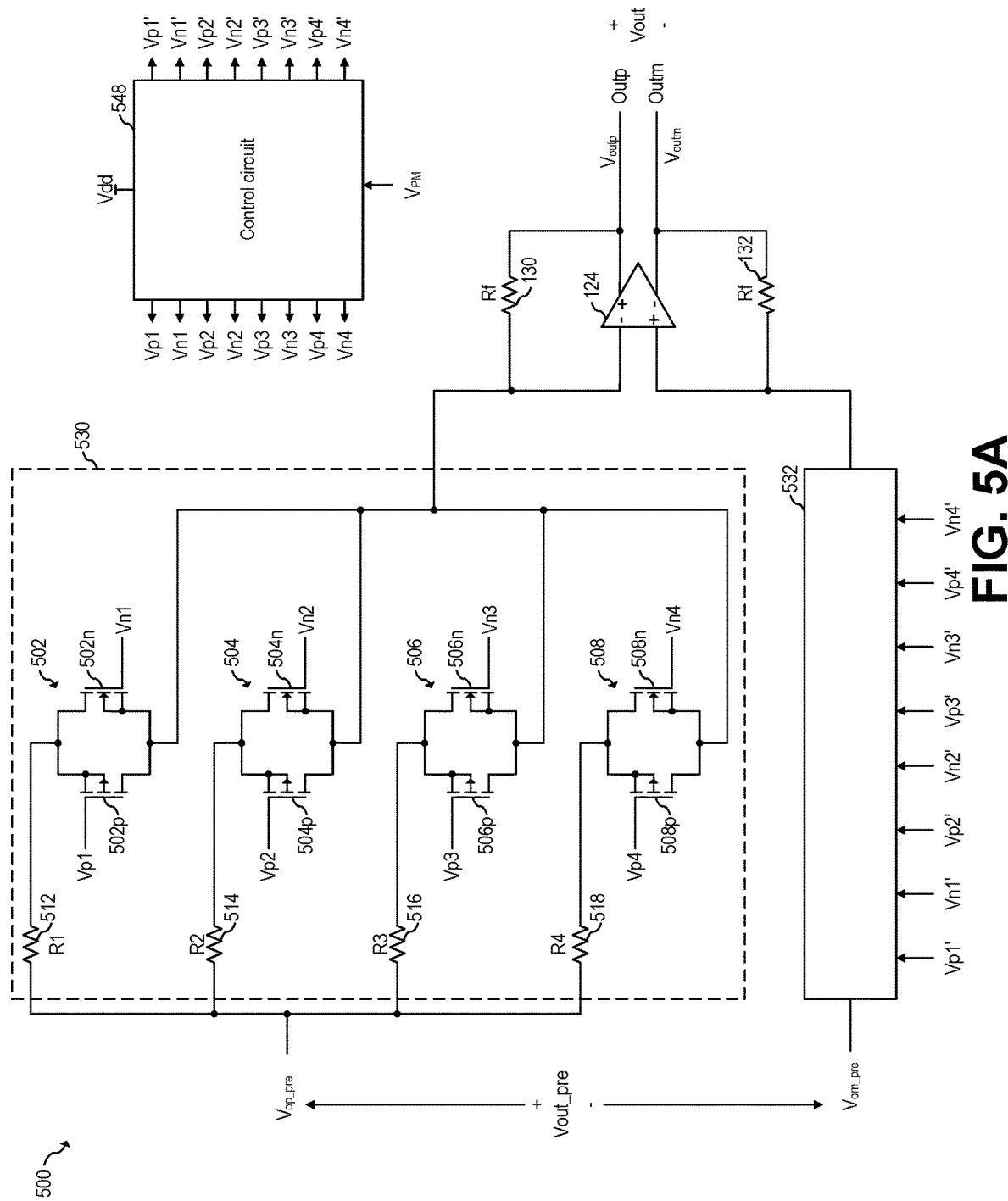
FIG. 5A shows a schematic diagram of the second stage of FIG. 3, according to an embodiment of the present invention.

In some embodiments, during a transition from mute mode to play mode, the switches of switch circuits 330 and 332 are progressively turned on; and during a transition from play mode to mute mode, the switches of switch circuits 330 and 332 are progressively turned off. For example, FIG. 5A shows a schematic diagram of second stage 500, according to an embodiment of the present invention. Second stage 500 includes switch circuits 530 and 532 and operational amplifier 124. Second stage 322 may be implemented as second stage 500. Switch circuits 330 and 332 may be implemented and switch circuits 530 and 532, respectively.

As shown in FIG. 5A, switch circuit 530 is a possible implementation of switch circuit 330 with n equal to 4 and includes 4 pass gates (502, 504, 506, 508) controlled by 8 control signals (Vp1, Vn1, Vp2, Vn2, Vp3, Vn3, Vp4, Vn4). Although not illustrated in FIG. 5, switch circuit 532 includes a structure identical to switch circuit 530, including 4 resistors (512', 514', 516', 518') and 4 pass gates (502', 504', 506', 508') controlled by 8 control signals (Vp1', Vn1', Vp2', Vn2', Vp3', Vn3', Vp4', Vn4').

In some embodiments, resistance R1 of resistor 512 is equal to 40 Re, resistance R2 of resistor 514 is equal to 10 Re, resistance R3 of resistor 516 is equal to 2.67 Re, and resistance R4 of resistor 518 is equal to 2 Re so that the equivalent resistance of resistances R1, R2, R3, and R4, in parallel (R1//R2//R3//R4) is equal to Re. In some embodiments, resistance R1' of resistor 512' is equal R1, resistance R2' of resistor 514' is equal to R2, resistance R3' of resistor 516' is equal to R3, and resistance R4' of resistor 518' is equal to R4.

In some embodiments, the resistance different $\Delta R_{1,2}$ between R1 and R2 is higher than the resistance difference $\Delta R_{2,3}$ between R2 and R3, which is higher than the resistance difference $\Delta R_{3,4}$ between R3 and R4.

Control circuit 548 is configured to control the transistors of switch circuits 530 and 532. For example, as shown in FIG. 5A, control circuit 548 may generate voltages Vp1, Vp2, Vp3, Vp4, Vn1, Vn2, Vn3, Vn4, Vp1', Vp2', Vp3', Vp4', Vn1', Vn2', Vn3', and Vn4' for controlling transistors 502p, 504p, 506p, 508p, 502n, 504n, 506n, and 508n of switch circuit 530 and transistors 502p', 504p', 506p', 508p', 502n', 504n', 506n', and 508n' of switch circuit 532.

In some embodiments, Vp1=Vp1', Vp2=Vp2', Vp3=Vp3', Vp4=Vp4', Vn1=Vn1', Vn2=Vn2', Vn3=Vn3', and Vn4=Vn4'. In some such embodiments, the outputs of control circuit 548 supplying voltages Vp1', Vp2', Vp3', Vp4', Vn1', Vn2', Vn3', and Vn4' may be omitted and transistors 502p', 504p', 506p', 508p', 502n', 504n', 506n', and 508n' may be supplied with voltages Vp1, Vp2, Vp3, Vp4, Vn1, Vn2, Vn3, and Vn4, respectively.

Figure 5B:
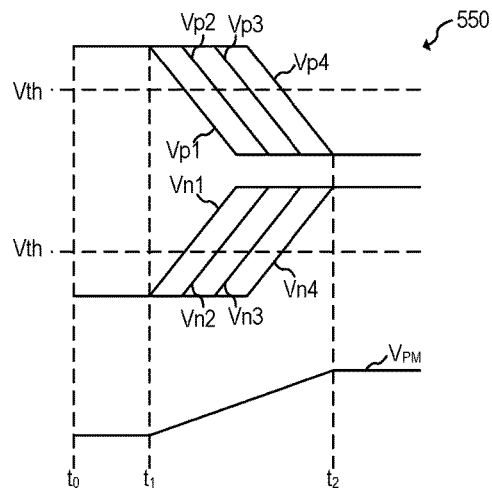
FIG. 5B shows waveforms of the switch circuit of FIG. 5A during transitions from mute mode to play mode, according to an embodiment of the present invention.
Figure 5C:
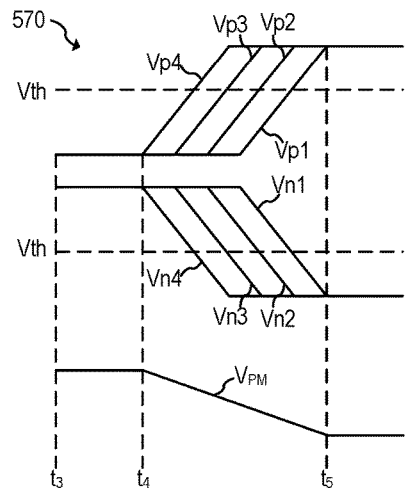
FIG. 5C shows waveforms of the switch circuit of FIG. 5A during transitions from play mode to mute mode, according to an embodiment of the present invention.

In some embodiments, control circuit 548 receives a voltage $V_{PM}$ (also referred to as play-mode voltage) and generates voltages Vp1, Vp2, Vp3, Vp4, Vn1, Vn2, Vn3, and Vn4, based on voltage $V_{PM}$. For example, in some embodiments, when voltage $V_{PM}$ is 0 V, second stage 500 is in mute mode, and when voltage $V_{PM}$ is at Vdd, second stage 500 is in play mode. During a transition from mute mode to play mode, as voltage $V_{PM}$ increases in a linear ramp form, voltage ramps with slopes having a higher magnitude that the slope of voltage ramp of $V_{PM}$ are progressively started (e.g., as shown in FIG. 5B) based on the voltage $V_{PM}$. During a transition from play mode to mute mode, as voltage $V_{PM}$ decreases in a linear ramp form, voltage ramps with slopes having a higher magnitude that the slope of voltage ramp of $V_{PM}$ are progressively started (e.g., as shown in FIG. 5C) based on the voltage $V_{PM}$.

FIG. 5B shows waveforms 550 of switch circuit 530 during transitions from mute mode to play mode, according to an embodiment of the present invention. Waveforms 550 includes curves illustrating voltages Vp1, Vp2, Vp3, Vp4, Vn1, Vn2, Vn3, and Vn4. In some embodiments, voltages Vp1', Vp2', Vp3', Vp4', Vn1', Vn2', Vn3', and Vn4' of switch circuit 532 are identical to voltages Vp1, Vp2, Vp3, Vp4, Vn1, Vn2, Vn3, and Vn4, respectively.

As shown in FIG. 5B, at time $t_0$, second stage 500 is in mute mode, with voltages Vp1, Vp2, Vp3, and Vp4 (and voltages Vp1', Vp2', Vp3', and Vp4') high, and voltages Vn1, Vn2, Vn3, and Vn4 (and voltages Vn1', Vn2', Vn3', and Vn4') low, thereby keeping pass gates 502, 504, 506, and 508 (and pass gates 502', 504', 506', and 508') off (open).

At time $t_1$, second stage 500 begins transitioning from mute mode to play mode by progressively turning on pass gates 502, 504, 506, and 508 (and pass gates 502', 504', 506', and 508'). For example, as shown in FIG. 5B, in some embodiments, a voltage ramp is used for turning on each of the pass gates 502, 504, 506, and 508 (and pass gates 502', 504', 506', and 508').

As shown in FIG. 5B, in some embodiments, the first pass gate to be turned on is the pass gate 502 (and 502') associated with resistor 512 (and 512'), which has the highest resistance R1 between resistors R1, R2, R3, and R4, followed by the turning on of the pass gate 504 (and 504') associated with resistor 514 having the second highest resistance R2, followed by the turning on of the pass gate 506 (and 506') associated with resistor 516 having the third highest resistance R3, followed by the turning on of the pass gate 508 (and 508') associated with resistor 518 having the lowest resistance R4. Thus, the gain of second stage 500 progressively changes from near 0 to Rf/Re as the equivalent resistance of switch circuit 530 transitions from ideally infinite (in practice, it may be, e.g., greater than 10000 times Re or more) to Re as pass gates 502, 504, 506 and 508 are progressively turned on. In some embodiments, the equivalent resistance of switch circuit 530 when all pass gates 502, 504, 506, and 508 are off may be tens of MΩ.

At time $t_2$, all pass gates 502, 504, 506, and 508 (and pass gates 502', 504', 506', and 508') are on (closed) and play mode begins. In some embodiments, the gain of second stage 500 during play mode is Rf/Re.

In some embodiments, the time between $t_1$ and $t_2$ may be, e.g., 20 ms. Other values, such as 25 ms, 30 ms, or higher, or 18 ms, 15 ms, or lower, may also be used.

As shown in FIG. 5B, in some embodiments, the switches of switch circuit 530 (and 532) are turned on progressively based on the reaching of a (e.g., fixed) threshold voltage such as the reaching of the threshold voltage Vth of the p-type transistors and/or n-type transistors of the pass gates 502, 504, 506, and 508, where the threshold voltage Vth represents the minimum gate-to-source voltage needed to create a conducting path between the source and the drain terminals of the transistor. In some embodiments, the threshold voltage is (e.g., slightly) below or (e.g., slightly) above the Vth of the p-type transistors and/or n-type transistors of the pass gates 502, 504, 506, and/or 508.

For example, in some embodiments, when voltage Vn1 reaches the threshold voltage Vth of transistor 502n, voltage Vn2 begins ramping up, when voltage Vn2 reaches the threshold voltage Vth of transistor 504n, voltage Vn3 begins ramping up, and when voltage Vn3 reaches the threshold voltage Vth of transistor 506n, voltage Vn4 begins ramping up. Similarly, when voltage Vp1 reaches the threshold voltage Vth of transistor 502p, voltage Vp2 begins ramping down, when voltage Vp2 reaches the threshold voltage Vth of transistor 504p, voltage Vp3 begins ramping down, and when voltage Vp3 reaches the threshold voltage Vth of transistor 506n, voltage Vp4 begins ramping down.

In some embodiments, voltage ramp Vn1 has opposite slope than voltage ramp Vp1 and begins simultaneously with voltage ramp Vp1; voltage ramp Vn2 has opposite slope than voltage ramp Vp2 and begins simultaneously with voltage ramp Vp2; voltage ramp Vn3 has opposite slope than voltage ramp Vp3 and begins simultaneously with voltage ramp Vp3; and voltage ramp Vn4 has opposite slope than voltage ramp Vp4 and begins simultaneously with voltage ramp Vp4.

FIG. 5C shows waveforms 570 of switch circuit 530 during transitions from play mode to mute mode, according to an embodiment of the present invention. Waveforms 570 includes curves illustrating voltages Vp1, Vp2, Vp3, Vp4, Vn1, Vn2, Vn3, and Vn4. In some embodiments, voltages Vp1', Vp2', Vp3', Vp4', Vn1', Vn2', Vn3', and Vn4' of switch circuit 532 are identical to voltages Vp1, Vp2, Vp3, Vp4, Vn1, Vn2, Vn3, and Vn4, respectively.

As shown in FIG. 5C, at time $t_3$, second stage 500 is in play mode, with voltages Vp1, Vp2, Vp3, and Vp4 (and voltages Vp1', Vp2', Vp3', and Vp4') low, and voltages Vn1, Vn2, Vn3, and Vn4 (and voltages Vn1', Vn2', Vn3', and Vn4') high, thereby keeping pass gates 502, 504, 506, and 508 (and pass gates 502', 504', 506', and 508') on (closed).

At time $t_2$, second stage 500 begins transitioning from play mode to mute mode by progressively turning on pass gates 502, 504, 506, and 508 (and pass gates 502', 504', 506', and 508'). For example, as shown in FIG. 5C, in some embodiments, a voltage ramp is used for turning off each of the pass gates 502, 504, 506, and 508 (and pass gates 502', 504', 506', and 508').

As shown in FIG. 5C, in some embodiments, the first pass gate to be turned off is the pass gate 508 (and 508') associated with resistor 518 (and 518'), which has the lowest resistance R4 between resistors R1, R2, R3, and R4, followed by the turning off of the pass gate 506 (and 506') associated with resistor 516 having the second lowest resistance R3, followed by the turning off of the pass gate 504 (and 504') associated with resistor 514 having the third lowest resistance R2, followed by the turning off of the pass gate 502 (and 502') associated with resistor 512 having the highest resistance R1. Thus, the gain of second stage 500 progressively changes from Rf/Re to near 0 as the equivalent resistance of switch circuit 530 transitions from Re to ideally infinite as pass gates 502, 504, 506 and 508 are progressively turned off.

At time $t_5$, all pass gates 502, 504, 506, and 508 (and pass gates 502', 504', 506', and 508') are off (open) and mute mode begins.

In some embodiments, the time between $t_4$ and $t_5$ may be, e.g., 20 ms. Other values, such as 25 ms, 30 ms, or higher, or 18 ms, 15 ms, or lower, may also be used.

Figure 6:
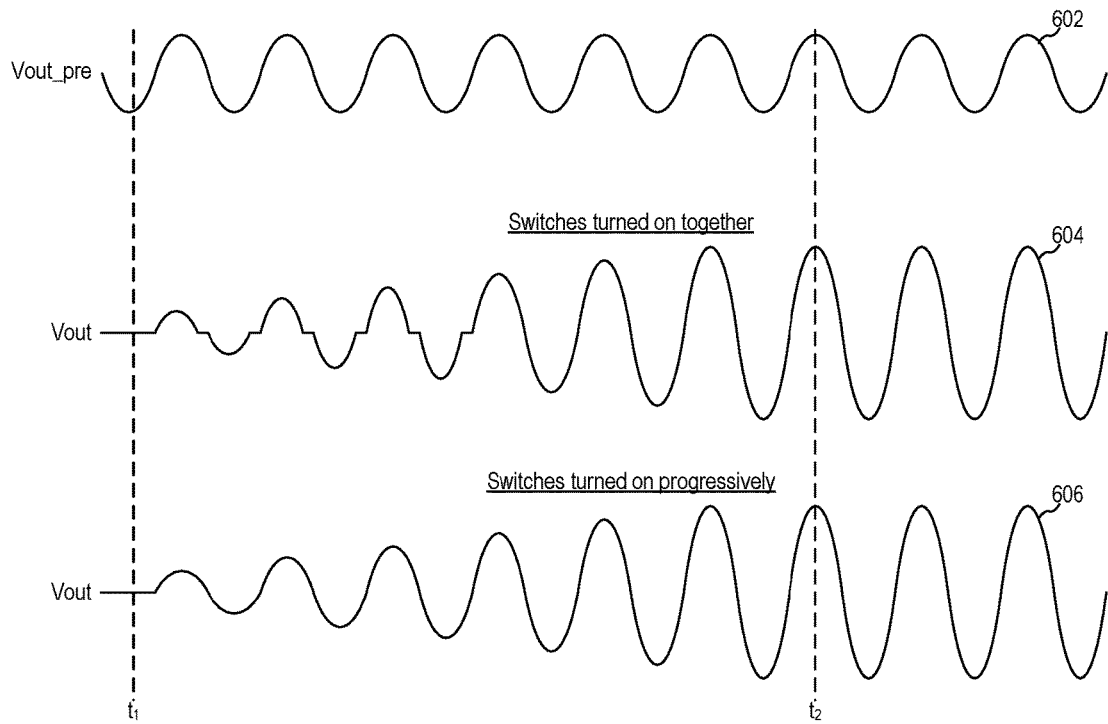
FIG. 6 illustrates a comparison between turning on the switches of the switch circuits of FIG. 5 together versus progressively turning on the switches of the switch circuits of FIG. 5 during a transition from mute mode to play mode, according to an embodiment of the present invention.

In some embodiments, by progressively turning on the plurality of pass gates of switch circuit 530 (and 532), second stage 500 advantageously reduces the small signal distortion during the transition between mute mode and play mode. For example, FIG. 6 illustrates a comparison between turning on the switches of switch circuit 530 and 532 together versus progressively turning on the switches of switch circuit 530 and 532 during a transition from mute mode to play mode, according to an embodiment of the present invention. Curve 602 illustrates voltage Vout_pre applied between inputs of second stage 500. Curve 604 illustrates voltage Vout delivered between outputs Outp and Outn of second stage 500 when switches 502, 504, 506, 508, 502', 504', 506' and 508' are ramped up together (e.g., with the same voltage ramp of negative slope applied to transistors 502p, 502p', 504p, 504p', 506p, 506p', 508p, and 508p', and with the same voltage ramp of positive slope applied to transistors 502n, 502n', 504n, 504n', 506n, 506n', 508n, and 508n', respectively). Curve 606 illustrates voltage Vout delivered between outputs Outp and Outn of second stage 500 when switches 502, 504, 506, 508, 502', 504', 506' and 508' are turned on progressively as shown in FIG. 5B.

As shown by curve 604, the turning on of the switches of switch circuits 530 and 532 together may cause distortion for small output voltages. The presence of such distortion may be attributed to a zone of weak conduction of the CMOS switch (e.g., 502, 504, 506, 508, 502', 504', 506', 508') during the transition between the CMOS switch being fully on and fully off.

In some embodiments, such distortion is reduced or eliminated by progressively turning on the switches of switch circuits 530 and 532, as illustrated by curve 606.

In some embodiments, the number n of pass gates of switches 530 and 532 may be very large, such as 40, 50, 100, or more, which would advantageously make the transition between play mode and mute mode very smooth. In some embodiments, the number n of pass gates of switches 530 and 532 is based on the threshold voltage of the transistors of the pass gates of switches 530 and 532 and on the supply voltage Vdd for second stage 500. For example, if the supply voltage Vdd powering second stage 500 (and used for a control voltage for the gates of the transistors of the pass gates 502, 504, 506, 508, 502', 504', 506', 508') is 3.3 V and the Vth of the transistors of switches 530 and 532 is 0.7, the number of pass gates may be lower than 3.3/0.7, such as the rounded down result of 3.3/0.7=4. By using a small number n of pass gates, the area usage of second stage 500 is advantageously reduced while still substantially reducing the small signal distortion during the transition between play mode and mute mode.

Figure 7:
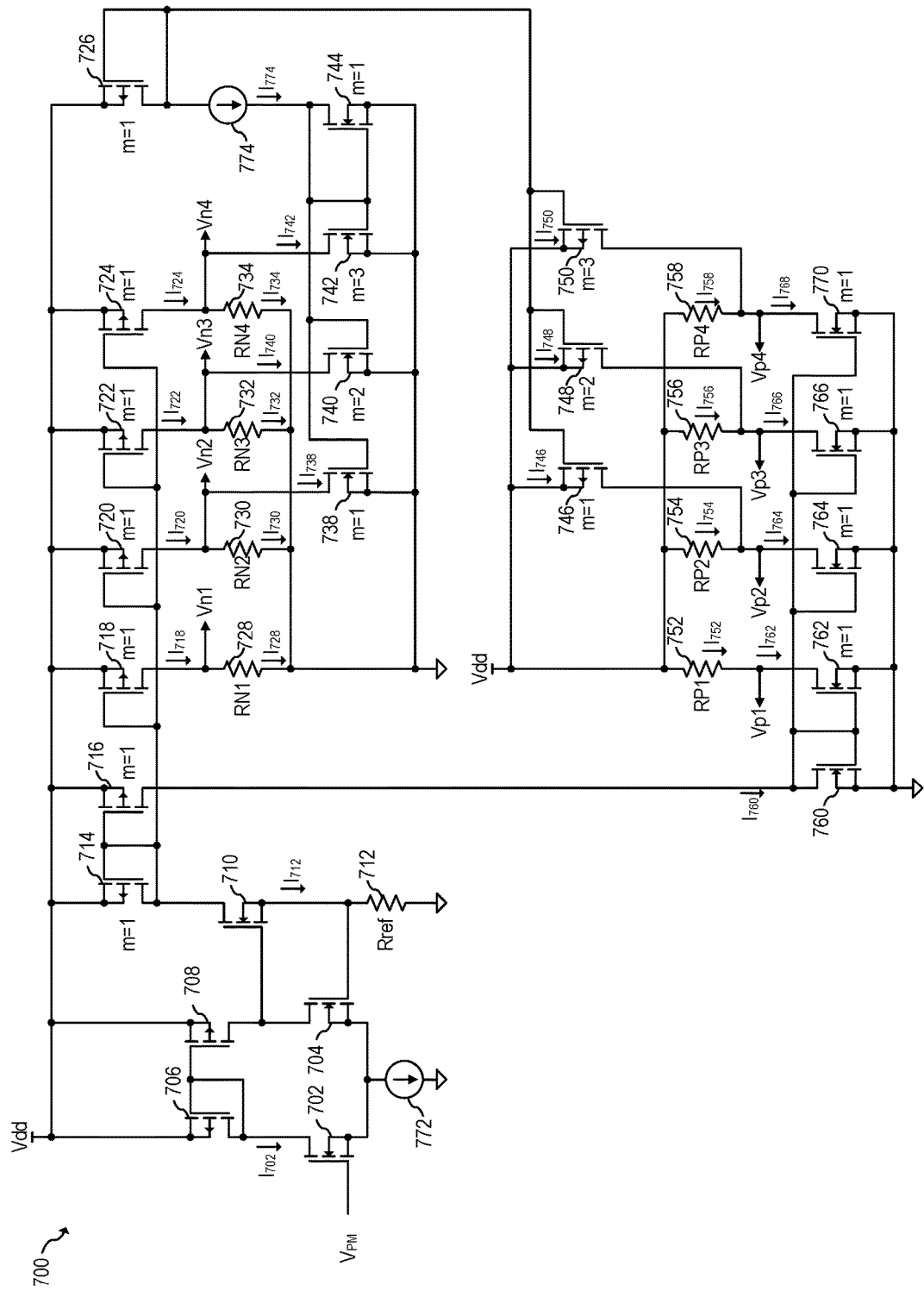
FIG. 7 shows a schematic diagram of the control circuit of FIG. 5, according to an embodiment of the present invention.

FIG. 7 shows a schematic diagram of control circuit 700, according to an embodiment of the present invention. Control circuit 548 may be implemented as control circuit 700.

In some embodiments, resistance Rref is equal to R, and resistances RN1, RN2, RN3, RN4, RP1, RP2, RP3, and RP4 are each equal to 3R. Other values are also possible.

During normal operation, current source 774 generates current $I_{774}$. Since the normalized size of transistors 744, 738, 740, and 742 is m=1, m=1, m=2, and m=3, respectively, current $I_{738}$ is equal to $I_{774}$, current $I_{740}$ is $2 \times I_{774}$, and current $I_{742}$ is $3 \times I_{774}$. Since the normalized size of transistors 726, 746, 748, and 750 is m=1, m=1, m=2, and m=3, respectively, current $I_{746}$ is equal to $I_{774}$, current $I_{748}$ is $2 \times I_{774}$, and current $I_{750}$ is $3 \times I_{774}$.

When voltage $V_{PM}$ is low (e.g., at 0 V), transistor 702 is off and current $I_{702}$ is zero, which causes current $I_{712}$ to be zero, which causes currents $I_{718}$, $I_{720}$, $I_{722}$, $I_{724}$, $I_{760}$, $I_{762}$, $I_{764}$, $I_{766}$, and $I_{768}$ to be zero. Since currents $I_{718}$, $I_{720}$, $I_{722}$, $I_{724}$, $I_{762}$, $I_{764}$, $I_{766}$, and $I_{768}$ are zero, voltages Vn1, Vn2, Vn3, and Vn4 are pulled to ground, and voltages Vp1, Vp2, Vp3, and Vp4 are pulled to Vdd, thereby causing transistors 502p, 504p, 506p, 508p, 502n, 504n, 506n, and 508n (and transistors 502p', 504p', 506p', 508p', 502n', 504n', 506n', and 508n') to be off. Thus, when voltage $V_{PM}$ is low (e.g., at 0 V), second stage 500 is in mute mode.

When voltage $V_{PM}$ begins to ramp up, current $I_{702}$ begins to ramp up, which causes current $I_{712}$ to begin to ramp up, which causes current $I_{718}$, $I_{720}$, $I_{722}$, $I_{724}$, $I_{760}$, $I_{762}$, $I_{764}$, $I_{766}$, and $I_{768}$ to begin to ramp up. As current I718 begins to ramp up, current $I_{728}$ begins to ramp up which causes voltage Vn1 to begin to ramp up. However, even though current $I_{720}$ begins to ramp up simultaneously with current 718, current $I_{730}$ remains at zero until current $I_{720}$ becomes larger than current $I_{738}$, thereby causing a delay in the voltage ramp of voltage Vn2. Since currents $I_{718}$, $I_{720}$, $I_{722}$, and $I_{724}$ are equal to each other, and since current $I_{738} < I_{740} < I_{742}$, the voltage Vn3 begins to ramp up after voltage Vn2, and voltage Vn4 begins to ramp up after voltage Vn3.

In embodiments having resistance Rref equal to R, and resistances RN1, RN2, RN3, RN4, RP1, RP2, RP3, and RP4 each equal to 3 R, and Vdd equal to 3.3 V, then $$Vn1 = \frac{V_{PM}}{R} \cdot 3R = 3V_{PM};$$

$$Vn2 = \left(\frac{V_{PM}}{R} - I_{774}\right) \cdot 3R = 3V_{PM} - 3I_{774} \cdot R;$$

$$Vn3 = \left(\frac{V_{PM}}{R} - 2I_{774}\right) \cdot 3R = 3V_{PM} - 6I_{774} \cdot R;$$

$$Vn4 = \left(\frac{V_{PM}}{R} - 3I_{774}\right) \cdot 3R = 3V_{PM} - 9I_{774} \cdot R;$$

$$Vp1 = 3.3 - \frac{V_{PM}}{R} \cdot 3R = 3.3 - 3V_{PM};$$

$$Vp2 = 3.3 - \left(\frac{V_{PM}}{R} - I_{774}\right) \cdot 3R = 3.3 + 3I_{774} \cdot R - 3V_{PM};$$

$$Vp3 = 3.3 - \left(\frac{V_{PM}}{R} - 2I_{774}\right) \cdot 3R = 3.3 + 6I_{774} \cdot R - 3V_{PM}; \text{ and}$$

$$Vp4 = 3.3 - \left(\frac{V_{PM}}{R} - 3I_{774}\right) \cdot 3R = 3.3 + 9I_{774} \cdot R - 3V_{PM};$$

A similar behavior occurs with currents $I_{752}$, $I_{762}$, $I_{754}$, $I_{764}$, $I_{756}$, $I_{766}$, $I_{758}$, and $I_{768}$, which causes voltage Vp2 to begin the voltage ramp down after voltage Vp1, voltage Vp3 to begin the voltage ramp down after voltage Vp2, and voltage Vp4 to begin the voltage ramp down after voltage Vp3.

Once voltage $V_{PM}$ reaches Vdd, voltages Vn1, Vn2, Vn3, and Vn4 also reach Vdd, and voltages Vp1, Vp2, Vp3, and Vp4, reach ground, thereby causing transistors 502p, 504p, 506p, 508p, 502n, 504n, 506n, and 508n (and transistors 502p', 504p', 506p', 508p', 502n', 504n', 506n', and 508n') to be on. Thus, when voltage $V_{PM}$ is high (e.g., at Vdd), second stage 500 is in play mode.

A transition from play mode to mute mode occurs in a similar manner. For example, as voltage $V_{PM}$ begins to ramp down, voltages Vn1, Vn2, Vn3, and Vn4 begin to progressively ramp down, with Vn3 beginning to ramp down after Vn4, Vn2 beginning to ramp down after Vn3, and Vn1 beginning to ramp down after Vn2, and voltages Vp1, Vp2, Vp3, and Vp4 begin to progressively ramp up, with Vp3 beginning to ramp up after Vp4, Vp2 beginning to ramp up after Vp3, and Vp1 beginning to ramp up after Vp2. Once voltage $V_{PM}$ reaches ground, voltages Vn1, Vn2, Vn3, and Vn4 also reach ground, and voltages Vp1, Vp2, Vp3, and Vp4 reach Vdd, thereby causing transistors 502p, 504p, 506p, 508p, 502n, 504n, 506n, and 508n (and transistors 502p', 504p', 506p', 508p', 502n', 504n', 506n', and 508n') to be off when voltage $V_{PM}$ is 0 V.

Figure 8A:
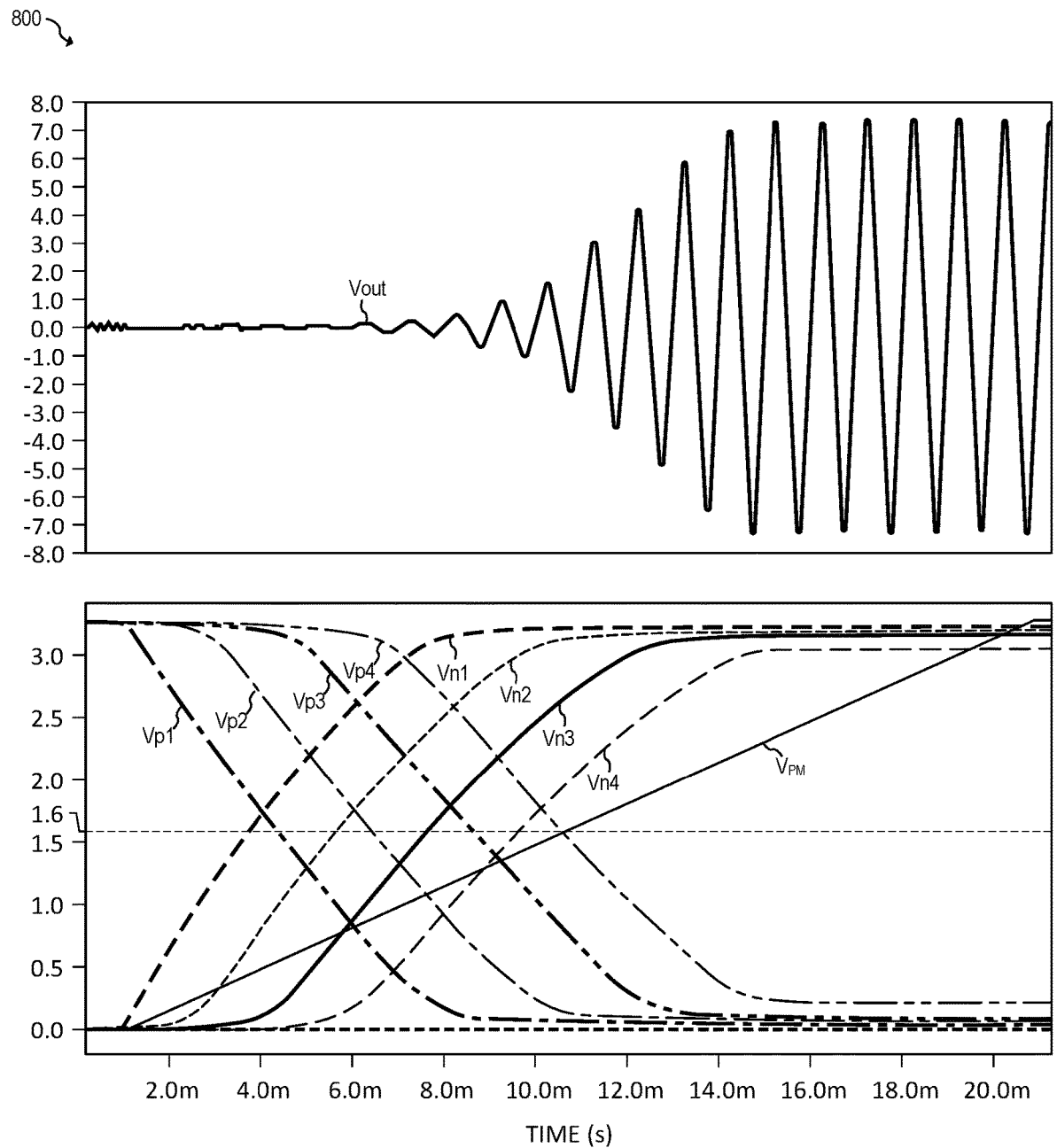
FIGS. 8A and 8B show waveforms of pass gates control voltages generated with the control circuit FIG. 7 during a transition from mute mode to play mode of the second stage of FIG. 5, according to an embodiment of the present invention.
Figure 8B:
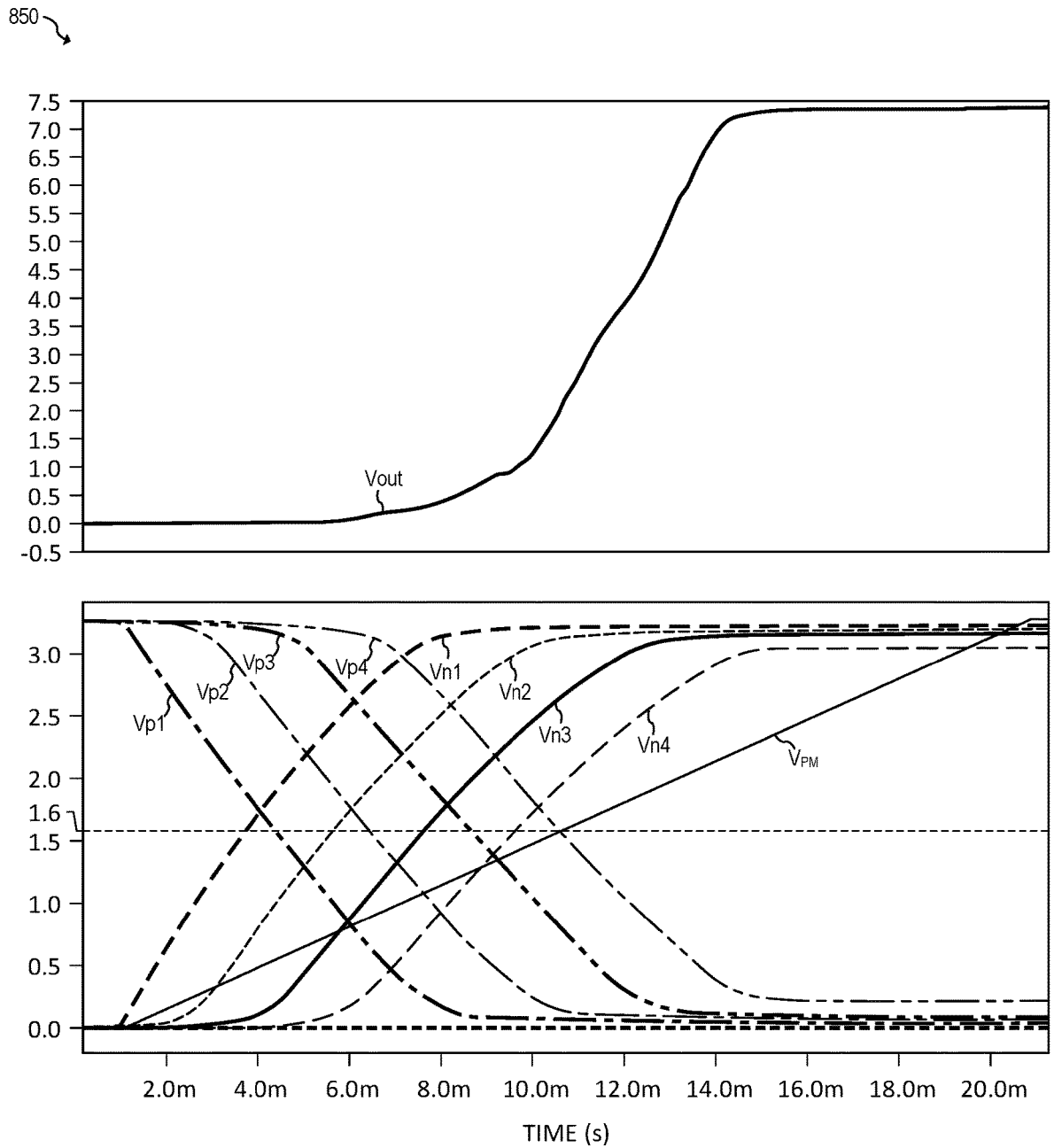

FIGS. 8A and 8B show waveforms of pass gates control voltages generated with control circuit 700 during a transition from mute mode to play mode of second stage 500, according to an embodiment of the present invention. Waveforms 800 show waveforms of second stage 500 with control circuit 548 implemented as control circuit 700, with the threshold voltage Vth of transistors 502p, 504p, 506p, 508p, 502n, 504n, 506n, and 508n having a magnitude of 0.7 V, and with Vdd equal to 3.3 V, and with voltage Vout_pre being a pure sinewave with constant amplitude. Waveforms 850 show waveforms of second stage 500 with control circuit 548 implemented as control circuit 700, with the threshold voltage Vth of transistors 502p, 504p, 506p, 508p, 502n, 504n, 506n, and 508n having a magnitude of 0.7 V, and with Vdd equal to 3.3 V, and with voltage Vout_pre being a DC voltage.

As shown in FIGS. 8A and 8B, voltage Vn2 begins ramping up when voltage Vn1 reaches 0.7 V, voltage Vn3 begins ramping up when voltage Vn2 reaches 0.7 V, voltage Vn4 begins ramping up when voltage Vn3 reaches 0.7 V, voltage Vp1 begins ramping down at the same time as voltage Vn1 begins ramping up, voltage Vp2 begins ramping down at the same time as voltage Vn2 begins ramping up, voltage Vp3 begins ramping down at the same time as voltage Vn3 begins ramping up, and voltage Vp4 begins ramping down at the same time as voltage Vn4 begins ramping up.

As also shown in FIGS. 8A and 8B, the last voltage ramp to cross voltage $V_{PM}$ is Vp4, which crosses voltage $V_{PM}$ at about Vdd/2=1.6 V. As shown in FIG. 8A, in some embodiments, the number of pass gates n and control circuit 700 are designed so that the last voltage ramp to cross voltage $V_{PM}$ during a transition between mute mode and play mode crosses voltage $V_{PM}$ at Vdd/2 or earlier.

As illustrated in FIGS. 8A and 8B, some embodiments advantageously achieve a transition between mute mode and play mode with a gradual gain change and with negligible small signal distortion during the transition.

In some embodiments, a transition between mute mode and play mode of an amplifier (e.g., 300) may be triggered, e.g., by an external controller, e.g., supplying voltage $V_{PM}$. In some embodiments, a transition between mute mode and play mode may be triggered based on thermal considerations, e.g., of the amplifier. For example, if an amplifier (e.g., 300) reaches a first predetermined temperature (e.g., 165° C.), the amplifier may transition from play mode to mute mode. When the amplifier cools back down to a second predetermined temperature (e.g., 150° C.), the amplifier transitions from mute mode to play mode.

In some embodiments, the amplifier may partially transition between play mode and mute mode by turning on/off some (but not all) of the pass gates of the switch circuits (e.g., 330, 332, 530, 532). For example, in some embodiments, when an amplifier (e.g., 300) reaches a first predetermined temperature (e.g., 150° C.), the amplifier turns off a first pass gate (e.g., 502 and 502'), thereby lowering the gain of the second stage (e.g., 500) and thus of the amplifier. When the amplifier reaches a second predetermined temperature (e.g., 155° C.), the amplifier turns off an additional pass gate (e.g., 504 and 504'), thereby further lowering the gain of the second stage. If the amplifier cools down back to, e.g., the first predetermined temperature, the additional pass gate may be turned on, thereby increasing back the gain of the second stage.

Figure 9:
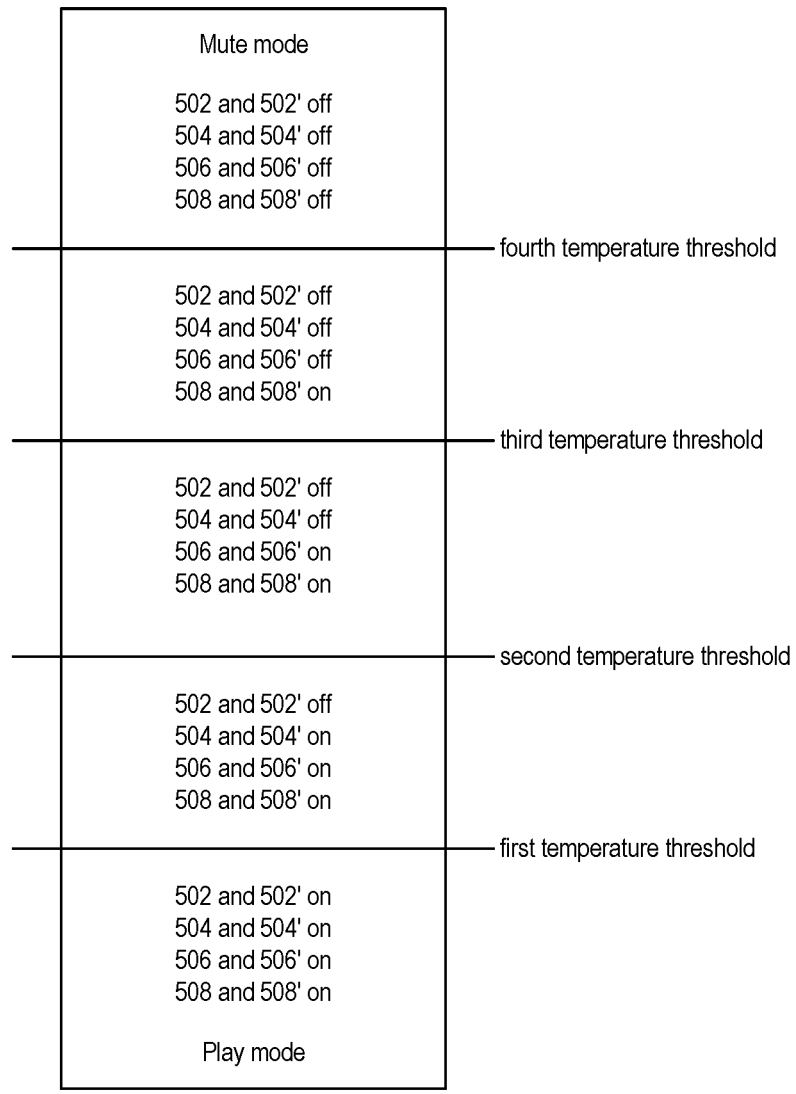
FIG. 9 illustrates transitions between play mode and mute mode, including partial transition states, based on a temperature of the amplifier of FIG. 3 using the second stage of FIG. 5, according to an embodiment of the present invention.

FIG. 9 illustrates transitions between play mode and mute mode, including partial transition states, based on a temperature of amplifier 300 implementing second stage 322 as second stage 500, according to an embodiment of the present invention.

As shown in FIG. 9, for temperatures below the first temperature threshold, amplifier 300 operates in play mode. For temperatures above the fourth temperature threshold, amplifier 300 operates in mute mode, and for temperatures between the first temperature threshold and the fourth temperature threshold, amplifier 300 operates in a reduced gain mode, in which the gain is reduced progressively as the temperature of amplifier 300 increases.

Although FIG. 9 illustrates an embodiment having 4 pass gates per switch circuit and having 3 reduced gain states, a different number of reduced gain states may be used, such as 2, 1, or 0. More generally, for an amplifier having an n pass gate switch circuit, 0 to n−1 reduced gain states may be implemented.

Although FIG. 9 illustrates the temperature thresholds as fixed threshold, in some embodiments, the temperature threshold may have hysteresis.

As shown, FIG. 9 illustrates a thermal control loop for controlling the gain of the amplifier based on the temperature of the amplifier. In some embodiments, the thermal control loop may be overwritten by, e.g., a controller or another control loop. For example, in some embodiments, the amplifier may be triggered (e.g., by an external controller) to transition from play mode to mute mode when the temperature of the amplifier is below the first temperature threshold.

Figure 10:
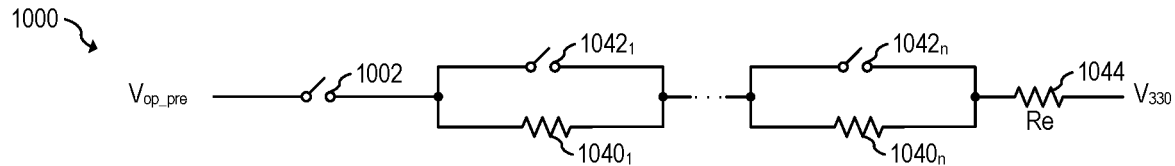
FIG. 10 illustrates a schematic diagram of a switch circuit, according to an embodiment of the present invention.

FIGS. 3, FIGS. 5A, and 7 illustrate embodiments in which the switches (e.g., 342, 352, 502, 504, 506, 508) are connected in series with the respective resistors (e.g., 340, 350, 512, 514, 516, and 518), and the equivalent resistance of the switch circuit (e.g., 330, 530) is progressively increased during a play to mute transition by progressively turning off the switches (e.g., 342, 352, 502, 504, 506, 508), and is progressively decreased during a mute to play transition by progressively turning on the pass gates (e.g., 502, 504, 506, 508). In some embodiments, the switch circuit may be arranged with switches connected in parallel with respective resistors. Other arrangements for increasing/decreasing the resistance of the switch circuit may also be used. For example, FIG. 10 illustrates a schematic diagram of switch circuit 1000, according to an embodiment of the present invention. Switch circuits 330, 332, 530, and/or 532 may be implemented as switch circuit 1000.

As can be seen in FIG. 10, during mute mode, switch 1002 is off (open) and the state of switches 1042 is irrelevant. During the beginning of a transition from mute mode to play mode, switch 1042 is off (open) and switches 1042 are off (open). The equivalent resistance of switch circuit 1000 may be progressively decreased during a mute to play transition by turning on switch 1002, and after turning on switch 1002 (e.g., when the control voltage of switch 1002 reaches Vth), progressively turning on switches $1042_x$ (e.g., in a similar manner as shown in FIG. 5B). During play mode switch 1002 is on (closed) and all switches 1042 are on (closed). As shown in FIG. 10, during play mode, the equivalent resistance of switch circuit 1000 is Re so that the gain of the second stage (e.g., 322) is Rf/Re.

The equivalent resistance of switch circuit 1000 may be progressively increased during a play to mute transition by starting with switches 1042 progressively turning off switches 1042 (e.g., in a similar manner as shown in FIG. 5C) and then turning off switch 1002 (e.g., when the controlling voltage of the last switch 1042 to be turned off, such as 10421, reaches Vth).

Advantages of some embodiments include achieving an easy degeneration of the signal to a very low condition, such as lower than −40 dB (e.g., such as lower than −60 dB, such as lower than −80 dB) during mute mode while reducing the weak conduction distortion (during a transition between mute mode and play mode) to a negligible value, without (e.g., substantially) increasing the area compared with traditional mute to play circuits, and without affecting the loop stability of the amplifier (e.g., since the resistance Rf of resistors 130 and 132 is not changing). In some embodiments, performing the transition between mute mode and play mode in soft steps advantageously causes smoother signal changes during transitions between mute mode and play mode.

Example embodiments of the present invention are summarized here. Other embodiments can also be understood from the entirety of the specification and the claims filed herein.

Example 1. An amplifier circuit configured to operate in a play mode and a mute mode, the amplifier circuit including: an input stage configured to receive an input signal; and a second stage having an input coupled to an output of the input stage, the second stage including a first switch circuit including first and second terminals, a plurality of resistive elements coupled between the first and second terminals of the first switch circuit, and a plurality of switches configured to control an equivalent resistance between the first and second terminals of the first switch circuit, where: during the play mode, the amplifier circuit is configured to generate an output signal at an output of the second stage based on the input signal, where, during play mode, the second stage has a gain between the input of the second stage and the output of the second stage of a first value, during a transition from the mute mode to the play mode, the amplifier circuit is configured to progressively increase the gain of the second stage from a second value to the first value by progressively turning on or off the plurality of switches, and during a transition from the play mode to the mute mode, the amplifier circuit is configured to progressively decrease the gain of the second stage from the first value to the second value by progressively turning on or off the plurality of switches.

Example 2. The amplifier circuit of example 1, where each resistive element of the plurality of resistive elements is coupled in series with a respective switch of the plurality of switches, where, during the transition from the mute mode to the play mode, the amplifier circuit is configured to progressively increase the gain of the second stage from the second value to the first value by progressively turning on the plurality of switches, and where, during the transition from the play mode to the mute mode, the amplifier circuit is configured to progressively decrease the gain of the second stage from the first value to the second value by progressively turning off the plurality of switches.

Example 3. The amplifier circuit of one of examples 1 or 2, where each resistive element of the plurality of resistive elements has a resistance different from each other.

Example 4. The amplifier circuit of one of examples 1 to 3, where the plurality of resistive elements includes a first resistor having a first resistance and a second resistor having a second resistance, where the first resistor is coupled in series with a first switch of the plurality of switches and the second resistor is coupled in series with a second switch of the plurality of switches, where the first resistance is the lowest resistance from all resistances of the resistive elements of the plurality of resistive elements, where the second resistance is the highest resistance from all resistances of the resistive elements of the plurality of resistive elements, and where, during the transition from the mute mode to the play mode, the amplifier circuit is configured to turn on the first switch firstly and the second switch lastly.

Example 5. The amplifier circuit of one of examples 1 to 4, where the plurality of resistive elements includes a first resistor having a first resistance and a second resistor having a second resistance, where the first resistor is coupled in series with a first switch of the plurality of switches and the second resistor is coupled in series with a second switch of the plurality of switches, where the first resistance is the lowest resistance from all resistances of the resistive elements of the plurality of resistive elements, where the second resistance is the highest resistance from all resistances of the resistive elements of the plurality of resistive elements, and where, during the transition from the play mode to the mute mode, the amplifier circuit is configured to turn off the second switch firstly and the first switch lastly.

Example 6. The amplifier circuit of one of examples 1 to 5, where the amplifier circuit is configured to progressively turn on or off the plurality of switches based on a time in which a control voltage of each switch of the plurality of switches crosses a threshold voltage.

Example 7. The amplifier circuit of one of examples 1 to 6, where the amplifier circuit is configured to progressively turn on or off the plurality of switches by sequentially applying a voltage ramp to each switch of the plurality of switches, where the amplifier circuit is configured to apply a first voltage ramp to a first switch of the plurality of switches, and apply a second voltage ramp to a second switch of the plurality of switches when the first voltage ramp reaches the threshold voltage.

Example 8. The amplifier circuit of one of examples 1 to 7, where the first switch includes a first metal-oxide semiconductor (MOS) transistor, and where the threshold voltage corresponds to a minimum gate-to-source voltage needed to create a conducting path between source and drain terminals of the first MOS transistor.

Example 9. The amplifier circuit of one of examples 1 to 8, where each switch of the plurality of switches includes a pass gate including an n-type transistor and a p-type transistor.

Example 10. The amplifier circuit of one of examples 1 to 9, where each of the n-type transistors of the plurality of includes a control terminal configured to receive a control voltage between a first supply voltage and a second supply voltage, the second supply voltage being higher than the first supply voltage, where the plurality of switches includes n switches, and where n is a positive integer greater than 1 and smaller than the second supply voltage divided by the threshold voltage.

Example 11. The amplifier circuit of one of examples 1 to 10, where n is equal to the highest integer smaller than the second supply voltage divided by the threshold voltage.

Example 12. The amplifier circuit of one of examples 1 to 11, further including a control circuit configured to provide control signals to the plurality of switches, the control circuit including: a first terminal configured to receive a play-mode voltage; a first current source circuit configured to generate a first current based on the play-mode voltage; a first plurality of current branches configured to generate respective first branch currents based on the first current, each current branch of the first plurality of current branches having a resistive element and an internal node coupled to the resistive element, where the internal node of each current branch of the first plurality of current branches is coupled to a control node of a respective transistor of the plurality of switches; a second current source circuit configured to generate a second current; and a second plurality of current branches configured to generate respective second branch currents based on the second current, each current branch of the second plurality of current branches coupled to the internal node of a respective current branch of the first plurality of current branches.

Example 13. The amplifier circuit of one of examples 1 to 12, where each of the first branch currents is equal to each other, and where each of the second branch currents is different from each other.

Example 14. The amplifier circuit of one of examples 1 to 13, where each of the second branch currents is a multiple of the second current.

Example 15. The amplifier circuit of example 1, where a resistive element of the plurality of resistive elements is coupled in parallel with a respective switch of the plurality of switches.

Example 16. The amplifier circuit of one of examples 1 to 15, where: the input stage is a differential input stage, and the input signal is a differential input signal so that the differential input stage is configured to receive the differential input signal; the input of the second stage is a differential input, and the output of the input stage is a differential output so that the differential input of the second stage is coupled to the differential output of the input stage; the output of the second stage is a differential output, and the output signal is a differential output signal so that, during the play mode, the amplifier circuit is configured to generate the differential output signal at the differential output of the second stage based on the differential input signal; the differential input of the second stage includes first and second inputs, the differential output of the second stage includes first and second outputs; and the first terminal of the first switch circuit is coupled to the first input of the differential input of the second stage and the second terminal of the first switch circuit is coupled to the first output of the differential output of the second stage; and the amplifier circuit further including a second switch circuit having a first terminal coupled to the second input of the differential input of the second stage and a second terminal coupled to the second output of the differential output of the second stage, the second switch circuit including a plurality of resistive elements coupled between the first and second terminals of the second switch circuit, and a plurality of switches configured to control an equivalent resistance between the first and second terminals of the second switch circuit.

Example 17. The amplifier circuit of one of examples 1 to 16, where the amplifier circuit is configured to control the first and second switch circuits with the same control signals.

Example 18. The amplifier circuit of one of examples 1 to 17, where the second stage further including an operational amplifier having an input coupled to the second terminal of the first switch circuit, and a resistive element coupled between an output of the operational amplifier and the second terminal of the first switch circuit, where the first terminal of the first switch circuit is coupled to the input of the second stage.

Example 19. The amplifier circuit of one of examples 1 to 18, where the amplifier circuit is configured to transition from the mute mode to the play mode within 20 ms.

Example 20. The amplifier circuit of one of examples 1 to 19, where the second value is lower than 60 dB lower than the first value.

Example 21. The amplifier circuit of one of examples 1 to 20, where the amplifier circuit is an audio amplifier circuit.

Example 22. A method for operating an amplifier circuit having a play mode and a mute mode, the method including: receiving an input signal at an input of an input stage, where a second stage has an input coupled to an output of the input stage, the second stage including a first switch circuit including first and second terminals, a plurality of resistive elements coupled between the first and second terminals of the first switch circuit, and a plurality of switches configured to control an equivalent resistance between the first and second terminals of the first switch circuit; during the play mode, generating an output signal at an output of the second stage based on the input signal, where, during play mode, the second stage has a gain between the input of the second stage and the output of the second stage of a first value; during a transition from the mute mode to the play mode, progressively increasing the gain of the second stage from a second value to the first value by progressively turning on or off the plurality of switches; and during a transition from the play mode to the mute mode, progressively decreasing the gain of the second stage from the first value to the second value by progressively turning on or off the plurality of switches.

Example 23. A differential audio amplifier configured to operate in a play mode and a mute mode, the differential audio amplifier including: a differential input stage configured to receive a differential input audio signal; and a differential second stage having a differential input coupled to a differential output of the differential input stage, the differential second stage including first and second switch circuits, each of the first and second switch circuits including first and second terminals, a plurality of resistive elements coupled between the first and second terminals, and a plurality of switches configured to control an equivalent resistance between the first and second terminals, where: during the play mode, the differential audio amplifier is configured to generate a differential audio output signal at a differential output of the differential second stage based on the differential input audio signal, where, during play mode, the differential second stage has a gain between the differential input of the differential second stage and the differential output of the differential second stage of a first value, during a transition from the mute mode to the play mode, the differential audio amplifier is configured to progressively increase the gain of the differential second stage from a second value to the first value by progressively turning on or off the plurality of switches of the first and second switch circuits, and during a transition from the play mode to the mute mode, the differential audio amplifier is configured to progressively decrease the gain of the differential second stage from the first value to the second value by progressively turning on or off the plurality of switches of the first and second switch circuits.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An amplifier circuit configured to operate in a play mode and a mute mode, the amplifier circuit comprising:
an input stage configured to receive an input signal; and
a second stage having an input coupled to an output of the input stage, the second stage comprising a first switch circuit comprising first and second terminals, a plurality of resistive elements coupled between the first and second terminals of the first switch circuit, and a plurality of switches configured to control an equivalent resistance between the first and second terminals of the first switch circuit, wherein:
each resistive element of the plurality of resistive elements has a resistance value different from each other resistive element, wherein the resistance values are configured such that, in response to all of the plurality of switches being closed, the equivalent resistance of the plurality of resistive elements in parallel is equal to a target resistance value that sets a predetermined gain for the second stage during the play mode,
during the play mode, the amplifier circuit is configured to generate an output signal at an output of the second stage based on the input signal, wherein, during the play mode, the second stage has a gain between the input of the second stage and the output of the second stage of a first value,
during a transition from the mute mode to the play mode, the amplifier circuit is configured to progressively increase the gain of the second stage from a second value to the first value by progressively turning on or off the plurality of switches, and during a transition from the play mode to the mute mode, the amplifier circuit is configured to progressively decrease the gain of the second stage from the first value to the second value by progressively turning on or off the plurality of switches.

2. The amplifier circuit of claim 1, wherein each resistive element of the plurality of resistive elements is coupled in series with a respective switch of the plurality of switches, wherein, during the transition from the mute mode to the play mode, the amplifier circuit is configured to progressively increase the gain of the second stage from the second value to the first value by progressively turning on the plurality of switches, and wherein, during the transition from the play mode to the mute mode, the amplifier circuit is configured to progressively decrease the gain of the second stage from the first value to the second value by progressively turning off the plurality of switches.

3. The amplifier circuit of claim 2, wherein the plurality of resistive elements comprises a first resistor having a first resistance and a second resistor having a second resistance, wherein the first resistor is coupled in series with a first switch of the plurality of switches and the second resistor is coupled in series with a second switch of the plurality of switches, wherein the first resistance is the lowest resistance from all resistances of the resistive elements of the plurality of resistive elements, wherein the second resistance is the highest resistance from all resistances of the resistive elements of the plurality of resistive elements, and wherein, during the transition from the mute mode to the play mode, the amplifier circuit is configured to turn on the first switch firstly and the second switch lastly.

4. The amplifier circuit of claim 2, wherein the plurality of resistive elements comprises a first resistor having a first resistance and a second resistor having a second resistance, wherein the first resistor is coupled in series with a first switch of the plurality of switches and the second resistor is coupled in series with a second switch of the plurality of switches, wherein the first resistance is the lowest resistance from all resistances of the resistive elements of the plurality of resistive elements, wherein the second resistance is the highest resistance from all resistances of the resistive elements of the plurality of resistive elements, and wherein, during the transition from the play mode to the mute mode, the amplifier circuit is configured to turn off the second switch firstly and the first switch lastly.

5. The amplifier circuit of claim 2, wherein the amplifier circuit is configured to progressively turn on or off the plurality of switches based on a time in which a control voltage of each switch of the plurality of switches crosses a threshold voltage.

6. The amplifier circuit of claim 5, wherein the amplifier circuit is configured to progressively turn on or off the plurality of switches by sequentially applying a voltage ramp to each switch of the plurality of switches, wherein the amplifier circuit is configured to apply a first voltage ramp to a first switch of the plurality of switches, and apply a second voltage ramp to a second switch of the plurality of switches when the first voltage ramp reaches the threshold voltage.

7. The amplifier circuit of claim 6, wherein the first switch comprises a first metal-oxide semiconductor (MOS) transistor, and wherein the threshold voltage corresponds to a minimum gate-to-source voltage needed to create a conducting path between source and drain terminals of the first MOS transistor.

8. The amplifier circuit of claim 5, wherein each switch of the plurality of switches comprises a pass gate comprising an n-type transistor and a p-type transistor.

9. The amplifier circuit of claim 8, wherein each of the n-type transistors of the plurality of switches comprises a control terminal configured to receive a control voltage between a first supply voltage and a second supply voltage, the second supply voltage being higher than the first supply voltage, wherein the plurality of switches comprises n switches, and wherein n is a positive integer greater than 1 and smaller than the second supply voltage divided by the threshold voltage.

10. The amplifier circuit of claim 9, wherein n is equal to the highest integer smaller than the second supply voltage divided by the threshold voltage.

11. The amplifier circuit of claim 8, further comprising a control circuit configured to provide control signals to the plurality of switches, the control circuit comprising:
a first terminal configured to receive a play-mode voltage;
a first current source circuit configured to generate a first current based on the play-mode voltage;
a first plurality of current branches configured to generate respective first branch currents based on the first current, each current branch of the first plurality of current branches having a resistive element and an internal node coupled to the resistive element, wherein the internal node of each current branch of the first plurality of current branches is coupled to a control node of a respective transistor of the plurality of switches;
a second current source circuit configured to generate a second current; and
a second plurality of current branches configured to generate respective second branch currents based on the second current, each current branch of the second plurality of current branches coupled to the internal node of a respective current branch of the first plurality of current branches.

12. The amplifier circuit of claim 11, wherein each of the first branch currents is equal to each other, and wherein each of the second branch currents is different from each other.

13. The amplifier circuit of claim 12, wherein each of the second branch currents is a multiple of the second current.

14. The amplifier circuit of claim 1, wherein a resistive element of the plurality of resistive elements is coupled in parallel with a respective switch of the plurality of switches.

15. The amplifier circuit of claim 1, wherein:
the input stage is a differential input stage, and the input signal is a differential input signal so that the differential input stage is configured to receive the differential input signal;
the input of the second stage is a differential input, and the output of the input stage is a differential output so that the differential input of the second stage is coupled to the differential output of the input stage;
the output of the second stage is a differential output, and the output signal is a differential output signal so that, during the play mode, the amplifier circuit is configured to generate the differential output signal at the differential output of the second stage based on the differential input signal;
the differential input of the second stage comprises first and second inputs, the differential output of the second stage comprises first and second outputs; and
the first terminal of the first switch circuit is coupled to the first input of the differential input of the second stage and the second terminal of the first switch circuit is coupled to the first output of the differential output of the second stage; and the amplifier circuit further comprising a second switch circuit having a first terminal coupled to the second input of the differential input of the second stage and a second terminal coupled to the second output of the differential output of the second stage, the second switch circuit comprising a plurality of resistive elements coupled between the first and second terminals of the second switch circuit, and a plurality of switches configured to control an equivalent resistance between the first and second terminals of the second switch circuit.

16. The amplifier circuit of claim 15, wherein the amplifier circuit is configured to control the first and second switch circuits with the same control signals.

17. The amplifier circuit of claim 1, wherein the second stage further comprising an operational amplifier having an input coupled to the second terminal of the first switch circuit, and an associated resistive element coupled between an output of the operational amplifier and the second terminal of the first switch circuit, wherein the first terminal of the first switch circuit is coupled to the input of the second stage.

18. The amplifier circuit of claim 1, wherein the amplifier circuit is configured to transition from the mute mode to the play mode within 20 ms.

19. The amplifier circuit of claim 1, wherein the second value is lower than 60 dB lower than the first value.

20. The amplifier circuit of claim 1, wherein the amplifier circuit is an audio amplifier circuit.

21. A method for operating an amplifier circuit having a play mode and a mute mode, the method comprising:
receiving an input signal at an input of an input stage, wherein a second stage has an input coupled to an output of the input stage, the second stage comprising a first switch circuit comprising first and second terminals, a plurality of resistive elements coupled between the first and second terminals of the first switch circuit, and a plurality of switches configured to control an equivalent resistance between the first and second terminals of the first switch circuit;
during the play mode, generating an output signal at an output of the second stage based on the input signal, wherein, during the play mode, the second stage has a gain between the input of the second stage and the output of the second stage of a first value;
detecting a temperature of the amplifier circuit;
transitioning from the play mode to a reduced gain mode in response to detecting that the temperature of the amplifier circuit exceeds a first temperature threshold, the transitioning to the reduced gain mode comprising progressively turning off at least one of the plurality of switches while maintaining at least one other of the plurality of switches in an on state;
transitioning to the mute mode by progressively turning off all of the plurality of switches in response to detecting that the temperature of the amplifier circuit exceeds a second temperature threshold higher than the first temperature threshold; and
transitioning from the mute mode or the reduced gain mode to the play mode by progressively turning on the plurality of switches in response to detecting that the temperature of the amplifier circuit falls below a third temperature threshold.

22. A differential audio amplifier configured to operate in a play mode and a mute mode, the differential audio amplifier comprising:
a differential input stage configured to receive a differential input audio signal; and
a differential second stage having a differential input coupled to a differential output of the differential input stage, the differential second stage comprising first and second switch circuits, each of the first and second switch circuits comprising first and second terminals, a plurality of resistive elements coupled between the first and second terminals, and a plurality of switches configured to control an equivalent resistance between the first and second terminals, wherein:
during the play mode, the differential audio amplifier is configured to generate a differential audio output signal at a differential output of the differential second stage based on the differential input audio signal, wherein, during the play mode, the differential second stage has a gain between the differential input of the differential second stage and the differential output of the differential second stage of a first value,
during a transition from the mute mode to the play mode, the differential audio amplifier is configured to progressively increase the gain of the differential second stage from a second value to the first value by progressively turning on or off the plurality of switches of the first and second switch circuits, and
during a transition from the play mode to the mute mode, the differential audio amplifier is configured to progressively decrease the gain of the differential second stage from the first value to the second value by progressively turning on or off the plurality of switches of the first and second switch circuits.

23. The amplifier circuit of claim 1, further comprising:
a temperature sensor configured to detect a temperature of the amplifier circuit; and
a thermal control circuit coupled to the temperature sensor and configured to:
control the amplifier circuit to transition from the play mode to a reduced gain mode in response to detecting that the temperature of the amplifier circuit exceeds a first temperature threshold, the transition from the play mode to the reduced gain mode comprising turning off at least one of the plurality of switches while maintaining at least one other of the plurality of switches in an on state,
control the amplifier circuit to transition to the mute mode in response to detecting that the temperature of the amplifier circuit exceeds a second temperature threshold higher than the first temperature threshold, the transition to the mute mode comprising turning off all of the plurality of switches; and
control the amplifier circuit to transition from the mute mode or the reduced gain mode to the play mode in response to detecting that the temperature of the amplifier circuit falls below a third temperature threshold.

* * * * *